United States Patent          (10) Patent No.:     US 7,462,439 B2
Jung et al.                                (45) Date of Patent:          *Dec. 9, 2008

(54) TOP ANTI-REFLECTIVE COATING POLYMER, ITS PREPARATION METHOD AND TOP ANTI-REFLECTIVE COATING COMPOSITION COMPRISING THE SAME

(75) Inventors: Jae Chang Jung, Seoul (KR); Cheol Kyu Bok, Icheon-shi (KR); Chang Moon Lim, Icheon-shi (KR); Seung Chan Moon, Yongin-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 314 days.

This patent is subject to a terminal disclaimer.

(21) Appl. No.: 11/159,735

(22) Filed: Jun. 23, 2005

(65) Prior Publication Data

US 2007/0003861 A1    Jan. 4, 2007

(30) Foreign Application Priority Data

Dec. 2, 2004    (KR) .................. 10-2004-0100527

(51) Int. Cl.
  *G03F 7/32*   (2006.01)
  *G03F 7/095*  (2006.01)
  *G03F 7/11*   (2006.01)
  *G03F 7/039*  (2006.01)
  *C08F 22/18*  (2006.01)

(52) U.S. Cl. ............. 430/273.1; 430/271.1; 430/311; 430/325; 430/326; 430/327; 526/245; 438/952

(58) Field of Classification Search ............. None
  See application file for complete search history.

(56) References Cited

U.S. PATENT DOCUMENTS

| | | | |
|---|---|---|---|
| 3,924,033 A * | 12/1975 | Gaeth et al. | 427/226 |
| 4,346,235 A | 8/1982 | Sonoda et al. | 562/596 |
| 5,204,930 A * | 4/1993 | Brandt et al. | 385/143 |
| 5,879,853 A | 3/1999 | Azuma | 430/166 |
| 5,939,242 A * | 8/1999 | Tang et al. | 430/329 |
| 6,048,672 A | 4/2000 | Cameron et al. | |
| 6,057,080 A | 5/2000 | Brunsvold et al. | 430/273.1 |
| 6,214,517 B1 * | 4/2001 | Sato et al. | 430/270.1 |
| 6,274,295 B1 | 8/2001 | Dammel et al. | 430/322 |
| 6,692,887 B1 * | 2/2004 | Suwa et al. | 430/270.1 |
| 6,723,485 B1 * | 4/2004 | Tsutsumi et al. | 430/270.1 |
| 6,783,912 B2 | 8/2004 | Cameron et al. | |
| 2003/0203310 A1 * | 10/2003 | Thackeray et al. | 430/270.1 |
| 2003/0219682 A1 | 11/2003 | Wakiya et al. | 430/273.1 |
| 2003/0235775 A1 * | 12/2003 | Padmanaban et al. | 430/270.1 |
| 2006/0008732 A1 | 1/2006 | Jung | 430/270.1 |

FOREIGN PATENT DOCUMENTS

| | | |
|---|---|---|
| EP | 0 454 335 B1 * | 7/1996 |
| JP | 57-004941 | 1/1982 |
| JP | 02-000974 | 1/1990 |
| JP | 03-226756 | 10/1991 |
| KR | 10-2006-0003399 | 1/2006 |

OTHER PUBLICATIONS

Hanawa et al "Study of PAG Size Effect on Lithographic Performance of 157nm Resists", Journal of Photopolymer Science and Technology, vol. 15, No. 4 (2002) pp. 619-624.*
Itani et al, "High transparency resist for 157 nm lithography" Journal of Vac. Sci. Technol. B 21 (6), Nov./Dec. 2003, pp. 3181-3185.*
Irie et al, "Evaluation of outgassing from a fluorinated resist for 157 nm lithography", Proceedings of SPIE, vol. 5376, Advances in Resist Technology and Processing XXI, John L. Sturtevant, ed, May 2004, pp. 226-237.*
Ferreira et al , SPEI, FOI. 333 pp. 236-244, published Jun. 1998.*
Hagiwara et al "Characterization of Fouropolymer Resist for 157 nm Lithography" Journal of Photopolymer Science and Tecnhology, vol. 16, No. 4, (2003) 557-564. No Month Given.*

* cited by examiner

*Primary Examiner*—Cynthia Hamilton
(74) *Attorney, Agent, or Firm*—Marshall, Gerstein & Borun LLP

(57) ABSTRACT

Disclosed herein is a top anti-reflective coating polymer represented by Formula 1, below:

$$\left(\begin{array}{c}\\ \end{array}\right)_a \left(\begin{array}{c} R_1 \\ \end{array}\right)_b \left(\begin{array}{c} R_2 \\ \end{array}\right)_c \quad (1)$$

$$\begin{array}{ccc} =O & =O & =O \\ | & | & | \\ O & OH & OR_3 \\ | & & \\ \end{array}$$

wherein R1 and R2 are independently hydrogen, fluoro, methyl or fluoromethyl; R3 is a C1-10 hydrocarbon or a C1-10 hydrocarbon in which the hydrogen atoms are partly replaced by fluorine atoms; and a, b and c, representing the mole fraction of each monomer, are in the range between 0.05 and 0.9. Because a top anti-reflective coating formed using the anti-reflective coating polymer of Formula 1 is not soluble in water, it can be applied to immersion lithography using water as a medium for a light source. In addition, because the top anti-reflective coating can reduce the reflectance from an underlying layer, the uniformity of CD is improved, thus enabling the formation of an ultra fine pattern.

22 Claims, 4 Drawing Sheets

TOP ANTI-REFLECTIVE COATING POLYMER, ITS PREPARATION METHOD AND TOP ANTI-REFLECTIVE COATING COMPOSITION COMPRISING THE SAME

BACKGROUND OF THE DISCLOSURE

1. Field of the Disclosure

The present disclosure relates to an anti-reflective coating polymer used in a photolithography process, which is one process for fabricating a semiconductor device, a method for preparing the anti-reflective coating polymer, and an anti-reflective coating composition comprising the anti-reflective coating polymer. More specifically, the present disclosure relates to a top anti-reflective coating polymer usable in immersion lithography for the fabrication of a sub-50 nanometer (nm) semiconductor device, a method for preparing the top anti-reflective coating polymer, and a top anti-reflective coating composition comprising the top anti-reflective coating polymer.

2. Description of the Related Technology

Photolithography is a process for the transfer of a semiconductor circuit pattern formed on a photomask to a wafer, and is one of the most important processes in determining the fineness and integration density of circuits in the fabrication of semiconductor devices.

In recent years, as the integration density of semiconductor devices has increased, new techniques have been developed that are adapted to the fine processing required in the fabrication of semiconductor devices. Under these circumstances, there is an increasing need for a fine processing technique in a photolithography process. That is, as the circuit line widths become finer and finer, the use of short-wavelength light sources for illumination, such as KrF, ArF, $F_2$ and EUV excimer lasers, and high numerical aperture lenses are required. EUV, $F_2$, ArF and KrF lasers in this order are preferentially used as light sources because of their short wavelength.

Particularly, a number of studies on the development of sub-50 nanometer (nm) devices have been actively undertaken. In response to these studies, recent attention has been directed toward the development of suitable processing equipment and materials associated with the use of $F_2$ and EUV as exposure light sources. Technical solutions for the use of $F_2$ are somewhat satisfactory, but there are the following problems: 1) high-quality $CaF_2$ is difficult to produce on an industrial scale within a short time, 2) because soft pellicles are likely to be deformed upon exposure to light at 157 nm, their life is short, and 3) hard pellicles incur considerable production costs, and are difficult to produce on a commercial scale due to their nature of light refraction.

On the other hand, since suitable light sources, exposure equipment, and masks are required to use EUV lasers, they are not yet suitable for practical use. Accordingly, the formation of finer high-precision photoresist patterns by using a photoresist adapted to the use of an ArF excimer laser have now become a key technical task. Under these circumstances, immersion lithography has recently drawn attention.

Dry lithography is a currently used lithography process, and is an exposure system wherein air is filled between an exposure lens and a wafer. In contrast to dry lithography, immersion lithography, which corresponds to an NA scaling technique, is an exposure system wherein water is filled between an exposure lens and a wafer. Since water (refractive index (n)=1.4) is used as a medium for a light source in the immersion lithography, the NA is 1.4 times larger than that in the dry lithography using air (refractive index (n)=1.0). Accordingly, immersion lithography is advantageous in terms of its high resolution.

A problem encountered with the fabrication of a sub-50 nm semiconductor device is that alteration of the critical dimension (CD) of a photoresist pattern inevitably takes place during a process for the formation of an ultra fine pattern. These alterations arise from standing waves, reflective notching due to the optical properties of a underlying layer on an overlying photoresist and due to variation in the thickness of the photoresist, and diffracted and reflected light from the underlying layer. To prevent the reflected light from the underlying layer, a light-absorbing material, called an "anti-reflective coating", at a wavelength band of light used as an exposure light source is introduced between the underlying layer and the photoresist. A bottom anti-reflective coating interposed between the underlying layer and the photoresist has been used to date. With the recent increase in the fineness of the photoresist patterns, a top anti-reflective coating (TARC) has also been introduced in order to prevent the photoresist pattern from being disrupted by both reflected and diffracted light. Specifically, as the miniaturization of semiconductor devices makes photoresist patterns extremely fine, the use of a bottom anti-reflective coating alone cannot completely prevent the patterns from being disrupted by scattered reflection. Accordingly, a top anti-reflective coating has been introduced to prevent the disruption of the patterns.

However, because conventional top anti-reflective coatings for use in dry lithography are water-soluble (in the case of using KrF or ArF laser), they cannot be applied to immersion lithography. In other words, because water is used as a medium for a light source in immersion lithography, it easily dissolves the conventional top anti-reflective coatings.

Accordingly, an ideal top anti-reflective coating for use in immersion lithography must satisfy the following requirements: 1) the top anti-reflective coating must be transparent to a light source; 2) the top anti-reflective coating must have a refractive index between 1.4 and 2.0, depending on the kind of an underlying photosensitive film (i.e. photoresist) to be used; 3) when the top anti-reflective coating composition is coated on an underlying photosensitive film, it must not dissolve the photosensitive film; 4) the top anti-reflective coating must not be soluble in water upon light exposure; 5) the top anti-reflective coating must be soluble in a developing solution; and 6) the top anti-reflective coating must enable the formation of a vertical pattern.

The above-mentioned stringent requirements make the development of a suitable top anti-reflective coating for use in immersion lithography difficult. Particularly, a new concept top anti-reflective coating composition is needed to satisfy the requirements of 6). Thus, there exists a need for the development of a top anti-reflective coating for use in immersion lithography which is water-insoluble and enables the formation of a vertical pattern upon formation of a semiconductor pattern.

SUMMARY OF THE INVENTION

Disclosed herein is a top anti-reflective coating polymer, which can be used in immersion lithography due to its water insolubility, can prevent the multiple interference of light inside a photoresist in the formation of a photoresist pattern, and can inhibit the alteration of the dimensions of the photoresist pattern resulting from the variation in the thickness of the photoresist. Also disclosed herein is a method for preparing the top anti-reflective coating polymer. Still further, disclosed herein is a top anti-reflective coating composition comprising the top anti-reflective coating polymer, and a method for forming a pattern by using the composition.

According to one aspect of the present disclosure, a top anti-reflective coating polymer is represented by Formula 1, below:

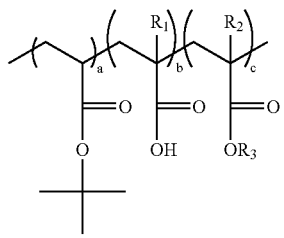

Formula 1 wherein $R_1$ and $R_2$ are independently hydrogen, fluoro, methyl or fluoromethyl; $R_3$ is a $C_{1-10}$ hydrocarbon or a $C_{1-10}$ hydrocarbon in which the hydrogen atoms are partly replaced by fluorine atoms; and a, b and c, representing the mole fraction of each monomer, are in the range between 0.05 and 0.9. According to another aspect of the present disclosure, a top anti-reflective coating composition includes the polymer represented by Formula 1, above.

According to another aspect of the present disclosure, there is provided a method for preparing the top anti-reflective coating polymer, particularly, poly(t-butylacrylate-methacrylic acid-2,2,3,4,4,4-hexafluorobutyl methacrylate) or poly(t-butylacrylate-2-(trifluoromethyl)acrylic acid-2,2,3,4,4,4-hexafluorobutyl methacrylate).

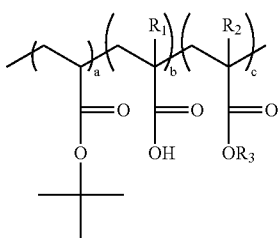

According to yet another aspect of the present disclosure, a method for forming a pattern of a semiconductor device includes applying a photoresist to a semiconductor substrate on which a particular underlying structure is formed; applying the top anti-reflective coating composition on top of the photoresist to form a top anti-reflective coating; and exposing the photoresist to light, followed by developing, to form a photoresist pattern.

BRIEF DESCRIPTION OF THE DRAWINGS

The foregoing features and other advantages of the present disclosure will be more clearly understood from the following detailed description taken in conjunction with the accompanying drawings, in which.

DETAILED DESCRIPTION OF THE PREFERRED EMBODIMENTS

Figure 1:
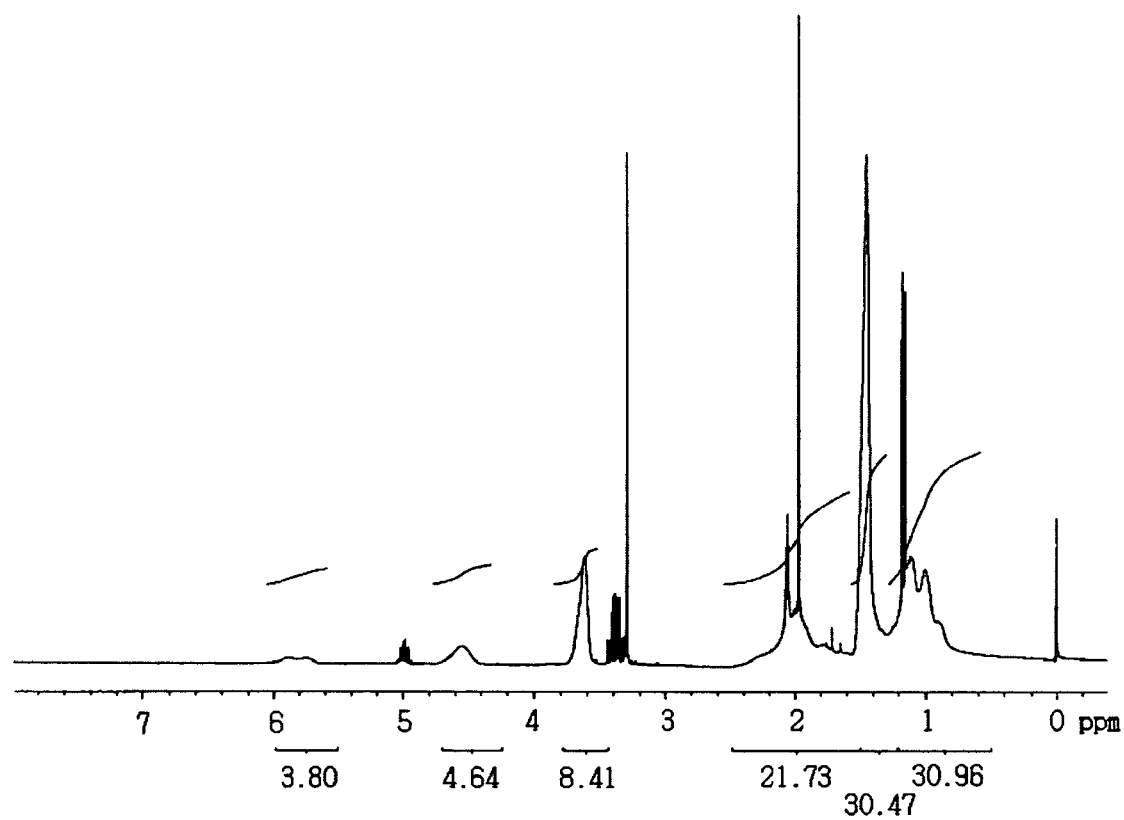
FIG. 1 is a $^1$H-NMR spectrum of a top anti-reflective coating polymer prepared in Example 1 of the present disclosure.

A top anti-reflective coating polymer is represented by Formula 1, below:

(1)

wherein $R_1$ and $R_2$ are independently hydrogen, fluoro, methyl or fluoromethyl; $R_3$ is a $C_{1-10}$ hydrocarbon or a $C_{1-10}$ hydrocarbon in which the hydrogen atoms are partly replaced by fluorine atoms; and a, b and c, representing the mole fraction of each monomer, are in the range between 0.05 and 0.9.

The top anti-reflective coating polymer of Formula 1 exhibits high light transmission, and is thus suited to the formation of a top anti-reflective coating. In addition, because the top anti-reflective coating polymer is highly soluble in a developing solution after light exposure, it has no effect on the formation of a pattern. Furthermore, because the top anti-reflective coating polymer is water-insoluble, it can be applied to immersion lithography. Moreover, because the top anti-reflective coating polymer can prevent scattered reflection from the top of a photoresist, it can effectively prevent a photoresist pattern from being disrupted by the scattered reflection.

Considering the physical properties, including solubility and reflective index, of an anti-reflective coating to be coated on top of the photoresist, the top anti-reflective coating polymer of the present invention has a weight average molecular weight of 1,000 to 1,000,000, and preferably 1,000 to 100,000. Too high a molecular weight causes a decrease in the solubility of the developing solution. As a result, a portion of the anti-reflective coating remains on the photoresist pattern even after development, causing pattern contamination. On the other hand, too low a molecular weight does not ensure an optimized reflective index of the anti-reflective coating and good overcoating on the photoresist.

Examples of the top anti-reflective coating polymer used in the present disclosure include, without limitation, polymers having the structure represented by Formula 1. Of these polymers, preferred are poly(t-butylacrylate-methacrylic acid-2,2,3,4,4,4-hexafluorobutyl methacrylate) represented by Formula 2, below:

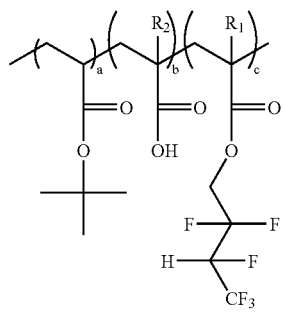

Formula 2 wherein $R_1$ and $R_2$ are independently a methyl group; and a, b and c, representing the mole fraction of each monomer, are in the range between 0.05 and 0.9; and poly(t-butylacrylate-2-(trifluoromethyl)acrylic acid-2,2,3,4,4,4-hexafluorobutyl methacrylate) represented by Formula 3, below:

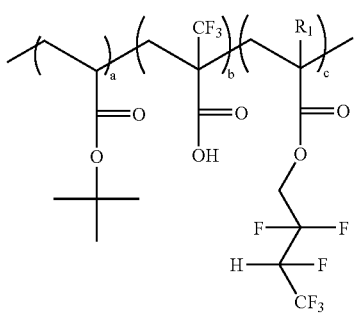

Formula 3 wherein $R_1$ is a methyl group; and a, b and c, representing the mole fraction of each monomer, are in the range between 0.05 and 0.9.

A method for preparing the poly(t-butylacrylate-methacrylic acid-2,2,3,4,4,4-hexafluorobutyl methacrylate) of Formula 2 includes dissolving a t-butylacrylate monomer, a methacrylic acid monomer and a 2,2,3,4,4,4-hexafluorobutyl methacrylate monomer in an organic solvent, adding a polymerization initiator to the solution, and subjecting the monomers to free-radical polymerization at 57° C.-77° C. for 2-10 hours.

The present invention further provides a method for preparing the poly(t-butylacrylate-2-(trifluoromethyl)acrylic acid-2,2,3,4,4,4-hexafluorobutyl methacrylate) of Formula 3 by dissolving a t-butylacrylate monomer, a 2-(trifluoromethyl)acrylic acid monomer and a 2,2,3,4,4,4-hexafluorobutyl methacrylate monomer in an organic solvent, adding a polymerization initiator to the solution, and subjecting the monomers to free-radical polymerization at 57° C. to 77° C. for 2 to 10 hours.

Examples of organic solvents that can be used in the preparation methods of the present invention include common organic solvents for free-radical polymerization. Preferably, the organic solvent is selected from the group consisting of acetone, PGMEA, tetrahydrofuran, cyclohexanone, dimethylformamide, dimethylsulfoxide, dioxane, methyl ethyl ketone, ethylacetate, benzene, toluene, and xylene. Acetone is most preferred.

Further, the polymerization initiator is preferably selected from the group consisting of 2,2'-azobisisobutyronitrile (AIBN), benzoylperoxide, acetylperoxide, laurylperoxide, t-butylperacetate, t-butylhydroperoxide, and di-t-butylperoxide. The use of 2,2'-azobisisobutyronitrile (AIBN) is most preferred.

The present invention also provides a top anti-reflective coating composition comprising a top anti-reflective coating polymer represented by Formula 1, below:

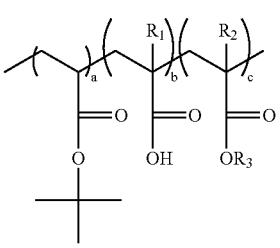

(1)

wherein $R_1$ and $R_2$ are independently hydrogen, fluoro, methyl or fluoromethyl; $R_3$ is a $C_{1-10}$ hydrocarbon or a $C_{1-10}$ hydrocarbon in which the hydrogen atoms are partly replaced by fluorine atoms; and a, b and c, representing the mole fraction of each monomer, are in the range between 0.05 and 0.9; a photoacid generator; and an organic solvent.

There is no particular restriction as to the kind of the photoacid generator used in the top anti-reflective coating composition of the present invention. Preferably, the photoacid generator is a compound represented by Formula 4, below:

Formula 4

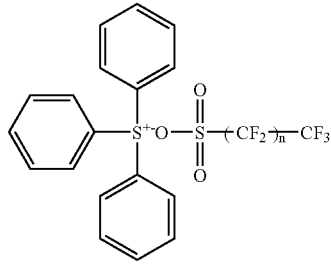

wherein n is a number of 7 to 25.

In the Formula 4, when n is lower than 7, a top anti-reflective coating is dissolved in an immersion solution (water) and thus the photoacid generator contained in the coating is precipitated, causing contamination of the exposure lens. Meanwhile, when n is above 26, the molecular weight of the compound of Formula 4 is too high and thus the acid is difficult to diffuse, causing problems in the subsequent developing step. Accordingly, the range of n is preferably limited to 7 to 25.

Because the compound of Formula 4 is hardly water-soluble and acts as a photoacid generator, it can be used to prepare a top anti-reflective coating composition for immersion lithography. In addition, the top anti-reflective coating composition does not dissolve a portion of a photoacid generator present at the top of an underlying photosensitizer upon pattern formation, thus preventing the top from being formed into a thick section. A preferred photoacid generator usable in the composition of the present invention is triphenylsulfonium perfluorooctanesulfonate (n =7 in Formula 4).

The top anti-reflective coating composition of the present invention comprises 0.05 weight percent (wt. %) to 5 wt. % of the photoacid generator, based on the weight of the top anti-reflective coating polymer. When the content of the photoacid generator in the top anti-reflective coating composition is less than 0.05 wt. %, the above-mentioned effects of the photoacid generator cannot be attained. Meanwhile, when the content of the photoacid generator exceeds 5 wt. %, a top anti-reflective coating to be formed absorbs light at 193 nm, significantly impairing the functions of the anti-reflective coating, thus the amount of light entering an underlying photosensitizer is decreased and, thus, a higher exposure energy is required, resulting in lower productivity. Accordingly, the content of the photoacid generator in the top anti-reflective coating composition is preferably limited to 0.05 wt. % to 5 wt. %, based on the weight of the top anti-reflective coating polymer. Organic solvents usable in the top anti-reflective coating composition of the present invention are not limited so long as they can dissolve the top anti-reflective coating polymer and the photoacid generator (e.g., triphenylsulfonium perfluorooctanesulfonate). n-Butanol is particularly preferred because it does not dissolve most underlying photosensitizers, preventing mixing between the top anti-reflective coating composition and an underlying photosensitizer when the composition is coated on the photosensitizer. Considering the thickness of the anti-reflective coating, n-butanol is preferably used in an amount of 1,000 wt. % to 10,000 wt. %, based on the weight of the top anti-reflective coating polymer. If the amount of n-butanol is outside this range, the thickness of the anti-reflective coating cannot be optimized.

The top anti-reflective coating composition may further comprise an acid diffusion inhibitor. The acid diffusion inhibitor is not specially limited so long as it can inhibit diffusion of an acid. L-proline is particularly preferred. The top anti-reflective coating composition of the present invention may comprise 1 wt. % to 20 wt. % of L-proline as the acid diffusion inhibitor, based on the weight of the top anti-reflective coating polymer. The acid diffusion inhibitor contained in the top anti-reflective coating composition acts to further inhibit the diffusion of an acid toward the unexposed region.

The top anti-reflective coating composition has an optimal reflective index of 1.4 to 2.0. Accordingly, when the top anti-reflective coating composition is over coated on top of a photoresist, the reflection can be minimized and thus the photoresist pattern can be protected from being disrupted by reflected light.

A method for forming a pattern of a semiconductor device includes: (a) applying a photoresist to a semiconductor substrate on which a particular underlying structure is formed; (b) applying the top anti-reflective coating composition on top of the photoresist to form a top anti-reflective coating; and (c) exposing the photoresist to light, followed by developing, to form a photoresist pattern. According to this pattern formation method, the anti-reflective coating formed on top of the photoresist is formed using the top anti-reflective coating composition. Because the top anti-reflective coating thus formed has a reflective index of 1.4 to 2.0, the reflectance at the top of the photoresist can be minimized. Accordingly, the photoresist pattern formed by this method greatly improves pattern uniformity. In a preferred embodiment of the pattern formation method, baking may be carried out before and/or after light exposure. The baking is preferably carried out at 70° C. to 200° C.

The anti-reflective coating composition and the pattern formation method are mainly applied to a process for forming an ultrafine pattern using an ArF light source (193 nm). Likewise, they can be applied to a process for forming an ultrafine pattern using a light source (e.g., $F_2$ or EUV) having a shorter wavelength, so long as water can be used as a medium for the light source. The light exposure using the light source is preferably achieved with an exposure energy of 0.1 millijoules per square centimeter ($mJ/cm^2$) to 50 $mJ/cm^2$.

In a preferred embodiment of the pattern formation method, the developing can be carried out using an alkaline developing solution. Preferably, the alkaline developing solution is a 0.01-5% (w/w) solution of tetramethylammoniumhydroxide (TMAH) in water.

The aforementioned top anti-reflective coating composition can be used in the fabrication of a semiconductor device. Because the top anti-reflective coating composition of the present invention can minimize scattered reflection, it can be applied to various processes for fabricating semiconductor devices, in addition to the formation process of an ultrafine pattern. It can be appreciated that the top anti-reflective coating composition of the present invention can be applied to a variety of processes in ways obvious to those skilled in the art, depending on the type of process. Accordingly, the detailed explanations concerning the application of the anti-reflective coating composition to the fabrication of semiconductor devices are omitted.

The present invention will now be described in more detail with reference to the following examples. However, these examples are given for the purpose of illustration and are not to be construed as limiting the scope of the invention.

EXAMPLE 1

Preparation of Top Anti-Reflective Coating Polymer: poly(t-butylacrylate-methacrylic acid-2,2,3,4,4,4-hexafluorobutyl methacrylate 3 grams (g) of t-butylacrylate, 2.5 g of methacrylic acid, 4.5 g of 2,2,3,4,4,4-hexafluorobutyl methacrylate and 0.2 g of AIBN were dissolved in 50 g of acetone. The monomers were polymerized at 67° C. for 6 hours. After completion of the polymerization, the polymerization product was precipitated in water, filtered, and dried in a vacuum to give poly(t-butylacrylate-methacrylic acid-2,2,3,4,4,4-hexafluorobutyl methacrylate) (yield: 72%) of Formula 2, below:

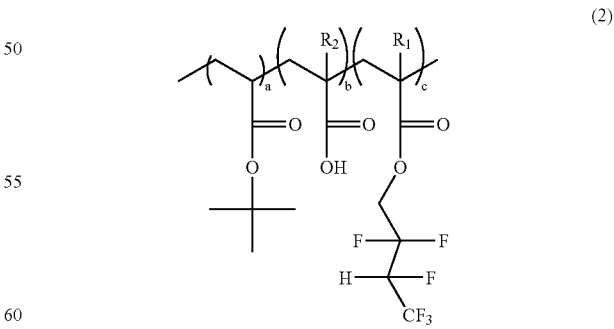

wherein $R_1$ and $R_2$ are independently a methyl group; and a, b and c, representing the mole fraction of each monomer, are in the range between 0.05 and 0.9.

The structure of the polymer was identified by $^1$H-NMR spectroscopy (FIG. 1).

EXAMPLE 2

Preparation of Top Anti-Reflective Coating Polymer: poly(t-butylacrylate-2-(trifluoromethyl)acrylic acid-2,2,3,4,4,4-hexafluorobutyl methacrylate 5 g of t-butylacrylate, 2.5 g of 2-(trifluoromethyl)acrylic acid, 2.5 g of 2,2,3,4,4,4-hexafluorobutyl methacrylate and 0.2 g of AIBN were dissolved in 50 g of acetone. The monomers were polymerized at 67° C. for 6 hours. After completion of the polymerization, the polymerization product was precipitated in water, filtered, and dried in a vacuum to give poly(t-butylacrylate-2-(trifluoromethyl)acrylic acid-2,2,3,4,4,4-hexafluorobutyl methacrylate) (yield: 75%) of Formula 3, below:

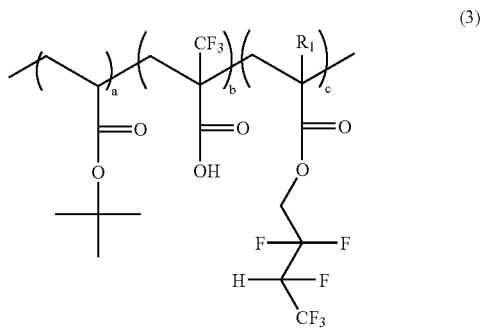

(3)

wherein $R_1$ is a methyl group; and a, b and c, representing the mole fraction of each monomer, are in the range between 0.05 and 0.9.

Figure 2:
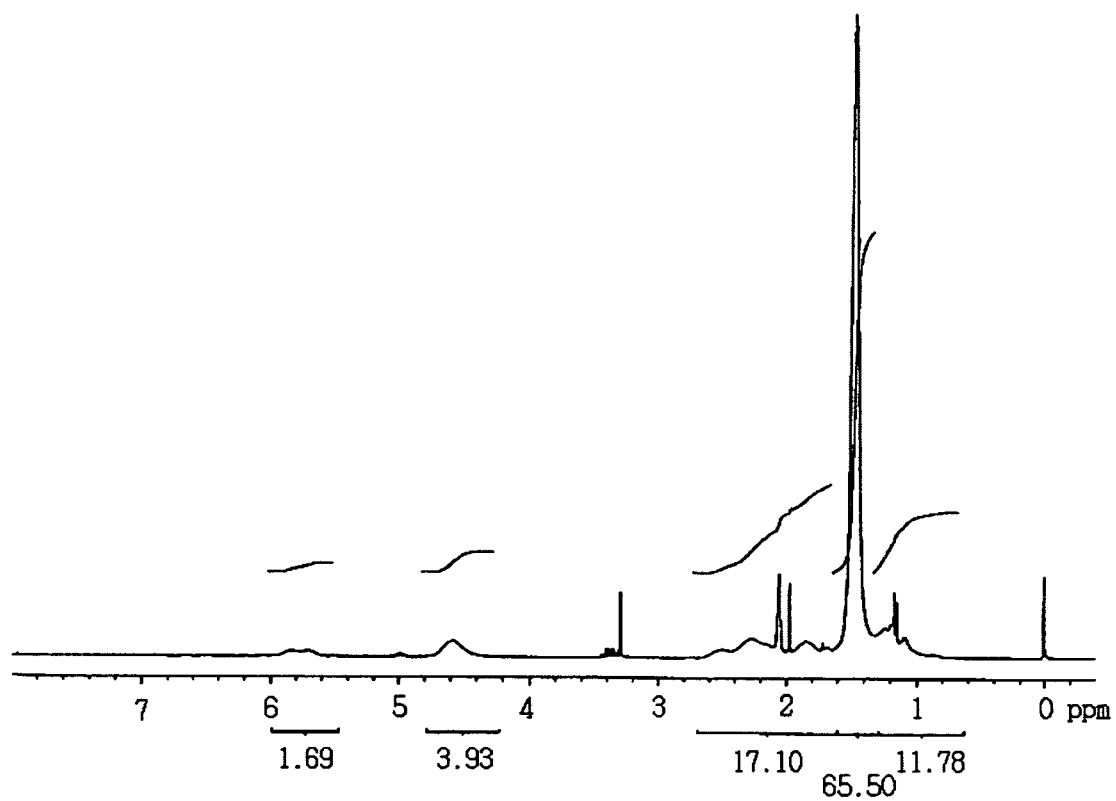
FIG. 2 is a $^1$H-NMR spectrum of a top anti-reflective coating polymer prepared in Example 2 of the present disclosure.

The structure of the polymer was identified by $^1$H-NMR spectroscopy (FIG. 2).

EXAMPLE 3

Preparation of Top Anti-Reflective Coating Composition And Pattern Formation 1.0 g of the poly(t-butylacrylate-methacrylic acid-2,2,3,4,4,4-hexafluorobutyl methacrylate) prepared in Example 1 and 0.08 g of triphenylsulfonium perfluorooctanesulfonate were dissolved in 60 g of n-butanol to provide a top anti-reflective coating composition for immersion lithography.

Figure 3:
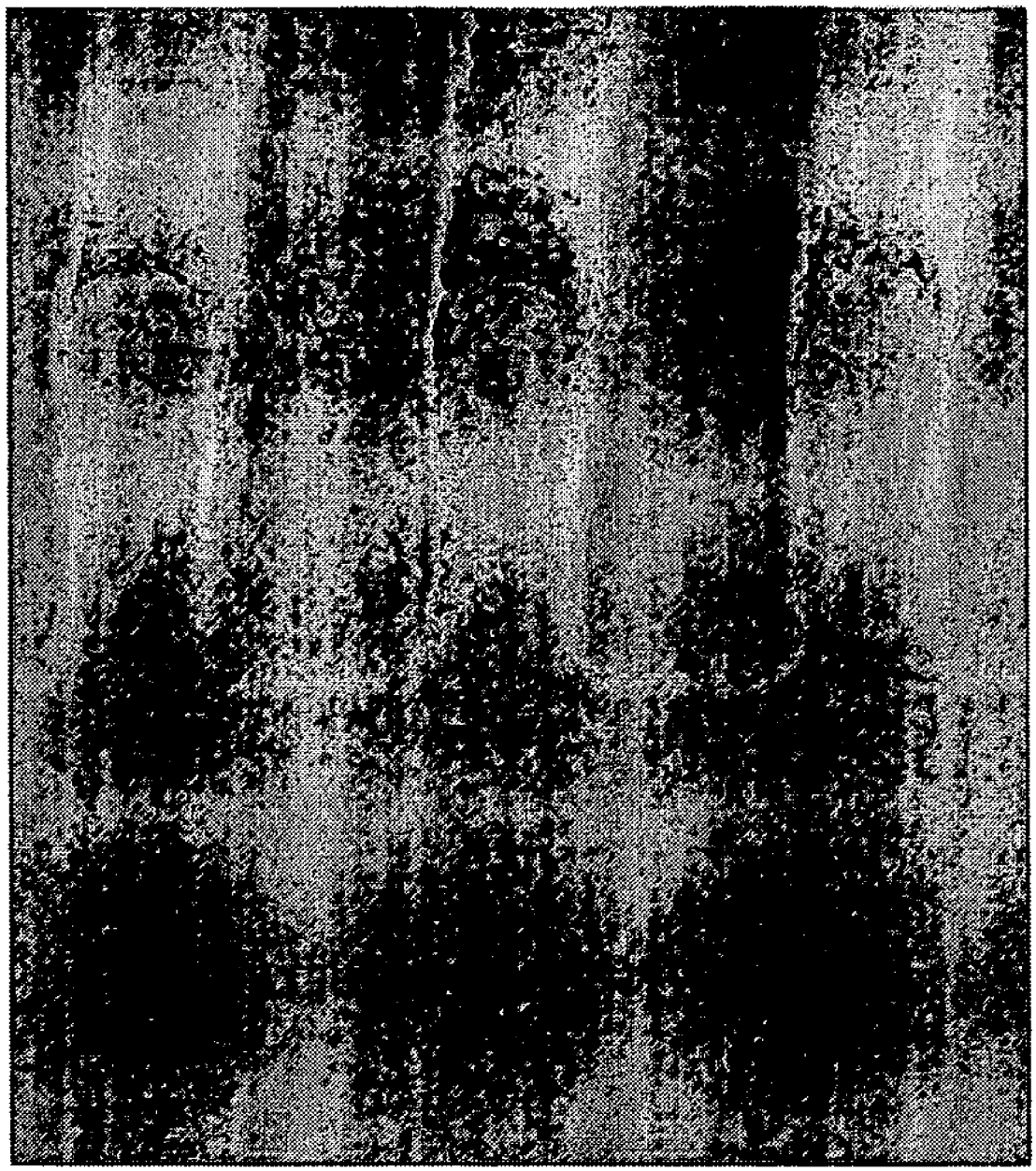
FIG. 3 is an 80 nm-L/S image of a semiconductor pattern formed using a top anti-reflective coating composition prepared in Example 3 of the present disclosure.

A photosensitizer (AR1221J, JSR) was coated to a thickness of 200 nm on a wafer, and baked at 130° C. for 90 seconds. The top anti-reflective coating composition was coated at 3,000 rpm on the coated photosensitizer. To confirm whether the top anti-reflective coating composition of the present invention can function as a protective film of the photosensitizer against water after coating, the wafer was immersed in water for 3 minutes. After exposing the wafer to light using ArF exposure equipment, the exposed wafer was baked at 130° C. for 90 seconds and developed to form a pattern. An image of the pattern is shown in FIG. 3. This image indicates that the pattern formed using the top anti-reflective coating was vertically formed.

EXAMPLE 4

Preparation of Top Anti-Reflective Coating Composition And Pattern Formation

A top anti-reflective coating composition was prepared in the same manner as in Example 3, except that the poly(t-butylacrylate-2-(trifluoromethyl)acrylic acid-2,2,3,4,4,4-hexafluorobutyl methacrylate) prepared in Example 2 was used as a top anti-reflective coating polymer. Further, a pattern was formed using the top anti-reflective coating composition in the same manner as in Example 3.

Figure 4:
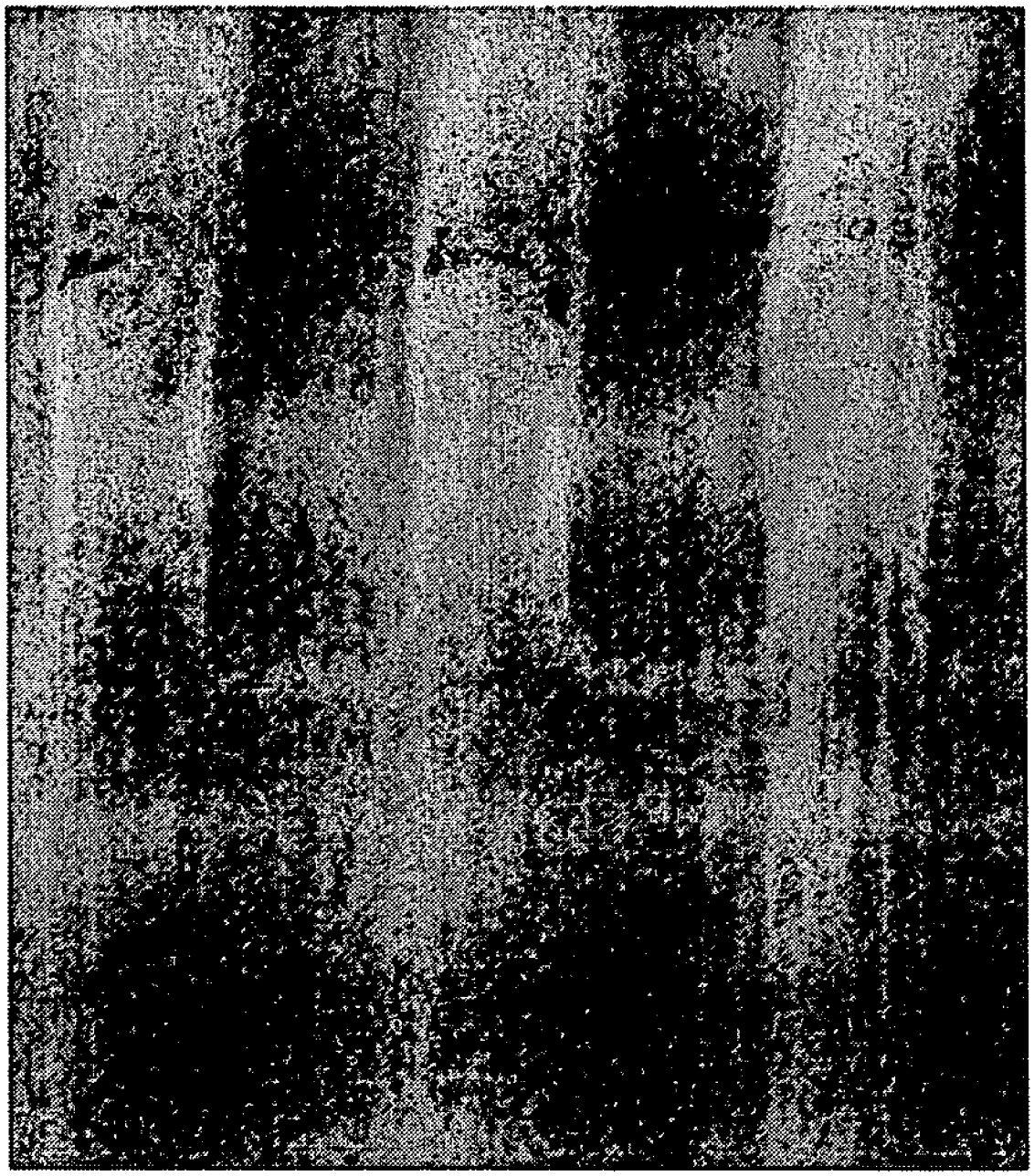
FIG. 4 is an 80 nm-L/S image of a semiconductor pattern formed using a top anti-reflective coating composition prepared in Example 4 of the present disclosure.

An image of the pattern thus formed is shown in FIG. 4. This image indicates that the pattern formed using the top anti-reflective coating was vertically formed.

As apparent from the above description, the top anti-reflective coating formed using the anti-reflective coating composition of the present invention satisfies the following requirements for use in immersion lithography: 1) since the top anti-reflective coating has a light transmission of 96% or higher, it is transparent to light sources; 2) the top anti-reflective coating has a refractive index between 1.4 and 2.0; 3) the top anti-reflective coating composition does not dissolve the underlying photosensitizer; 4) the top anti-reflective coating is not soluble in water upon light exposure; 5) the top anti-reflective coating is highly soluble in a developing solution; and 6) the top anti-reflective coating enables the formation of a vertical pattern. Particularly, because the top anti-reflective coating composition of the present invention does not dissolve a portion of a photoacid generator present at the top of an underlying photosensitizer upon formation of a top anti-reflective coating, it can prevent the top from being formed into a thick section. Accordingly, the top anti-reflective coating formed using the anti-reflective coating composition of the present invention can be applied to immersion lithography, and can decrease the reflectance at the top of the photoresist, thereby minimizing the alteration of CD.

In conclusion, because the top anti-reflective coating composition of the present invention enables the formation of a fine photoresist pattern, it contributes to the fabrication of sub-50 nm semiconductor devices in an efficient manner.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A poly(t-butylacrylate-methacrylic acid-2,2,3,4,4,4-hexafluorobutyl methacrylate) terpolymer represented by Formula 2, below:

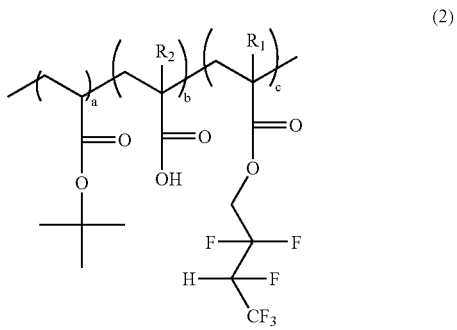

(2)

wherein $R_1$ and $R_2$ are independently a methyl group; and a, b and c, representing the mole fraction of each monomer, are in the range between 0.05 and 0.9.

2. A poly(t-butylacrylate-2-(trifluoromethyl)acrylic acid-2,2,3,4,4,4-hexafluorobutyl methacrylate) terpolymer represented by Formula 3, below:

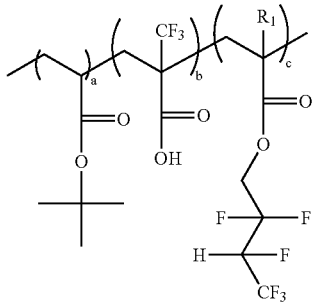

(3)

wherein $R_1$ is a methyl group; and a, b and c, representing the mole fraction of each monomer, are in the range between 0.05 and 0.9.

3. A method for preparing a poly(t-butylacrylate-methacrylic acid-2,2,3,4,4,4-hexafluorobutyl methacrylate) terpolymer represented by Formula 2, below:

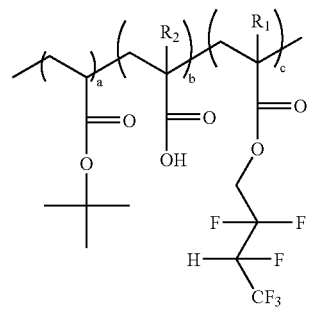

(2)

wherein $R_1$ and $R_2$ are independently a methyl group; and a, b and c, representing the mole fraction of each monomer, are in the range between 0.05 and 0.9, the method comprising:
(a) dissolving a t-butylacrylate monomer, a methacrylic acid monomer and a 2,2,3,4,4,4-hexafluorobutyl methacrylate monomer in an organic solvent;
(b) adding a polymerization initiator to the solution; and,
(c) subjecting the monomers to free-radical polymerization at 57° C. to 77° C. for 2 to 10 hours.

4. The method according to claim 3, wherein the organic solvent is a solvent selected from the group consisting of acetone, propylene glycol methyl ether acetate (PGMEA), tetrahydrofuran, cyclohexanone, dimethylformamide, dimethylsulfoxide, dioxane, methyl ethyl ketone, ethylacetate, benzene, toluene, and xylene.

5. The method according to claim 3, wherein the polymerization initiator is selected from the group consisting of 2,2'-azobisisobutyronitrile (AIBN), benzoylperoxide, acetylperoxide, laurylperoxide, t-butylperacetate, t-butylhydroperoxide, and di-t-butylperoxide.

6. A method for preparing a poly(t-butylacrylate-2-(trifluoromethyl)acrylic acid-2,2,3,4,4,4-hexafluorobutyl methacrylate) terpolymer represented by Formula 3, below:

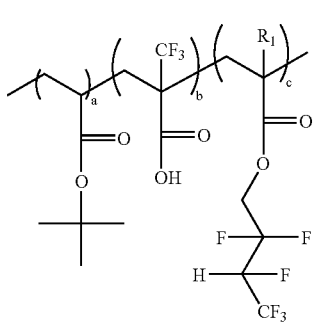

(3)

wherein $R_1$ is a methyl group; and a, b and c, representing the mole fraction of each monomer, are in the range between 0.05 and 0.9, the method comprising:
(a) dissolving a t-butylacrylate monomer, a 2-(trifluoromethyl)acrylic acid monomer and a 2,2,3,4,4,4-hexafluorobutyl methacrylate monomer in an organic solvent;
(b) adding a polymerization initiator to the solution; and,
(c) subjecting the monomers to free-radical polymerization at 57° C. to 77° C. for 2 to 10 hours.

7. A top anti-reflective coating composition comprising:
(a) a top anti-reflective coating terpolymer selected from the group consisting of
  (i) a poly(t-butylacrylate-methacrylic acid-2,2,3,4,4,4-hexafluorobutyl methacrylate) terpolymer represented by Formula 2, below:

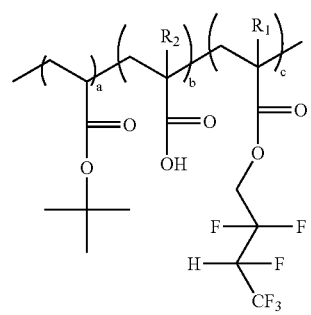

(2)

wherein $R_1$ and $R_2$ are independently a methyl group; and a, b and c, representing the mole fraction of each monomer, are in the range between 0.05 and 0.9;
  (ii) a poly(t-butylacrylate-2-(trifluoromethyl)acrylic acid-2,2,3,4,4,4-hexafluorobutyl methacrylate) terpolymer represented by Formula 3, below:

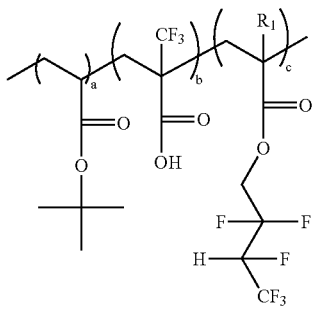

wherein $R_1$ is a methyl group; and a, b and c, representing the mole fraction of each monomer, are in the range between 0.05 and 0.9; and,
(iii) mixtures thereof
(b) a photoacid generator; and,
(c) an organic solvent.

8. The composition according to claim 7, wherein the photoacid generator is a compound represented by Formula 4, below:

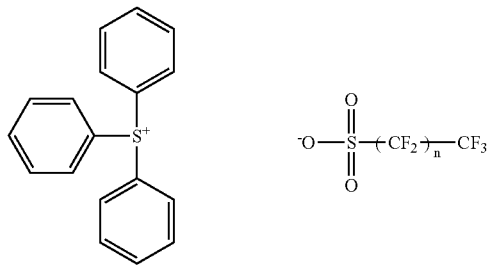

wherein n is a number of 7 to 25.

9. The composition according to claim 8, wherein the photoacid generator is triphenylsulfonium perfluorooctanesulfonate.

10. The composition according to claim 7, wherein the composition comprises 0.05 wt. % to 5 wt. % of the photoacid generator, based on the weight of the top anti-reflective coating terpolymer.

11. The composition according to claim 7, wherein the organic solvent is n-butanol.

12. The composition according to claim 11, wherein the composition is prepared by dissolving the top anti-reflective coating terpolymer in 1,000 wt. % to 10,000 wt. % of n-butanol, based on the weight of the terpolymer.

13. The composition according to claim 7, further comprising an acid diffusion inhibitor.

14. The composition according to claim 13, wherein the acid diffusion inhibitor is L-proline.

15. The composition according to claim 14, wherein the composition comprises 1 wt. % to 20 wt. % of the L-proline, based on the weight of the top anti-reflective coating terpolymer.

16. The composition according to claim 7, wherein the composition has a refractive index between 1.4 and 2.0.

17. A method for forming a pattern of a semiconductor device, the method comprising:
(a) applying a photoresist to a semiconductor substrate on which a particular underlying structure is formed;
(b) applying the top anti-reflective coating composition according to claim 9 on top of the photoresist to form a top anti-reflective coating; and,
(c) exposing the photoresist to light, followed by developing the photoresist, to form a photoresist pattern.

18. The method according to claim 17, wherein baking is further carried out at least one of before light exposure and after light exposure.

19. The method according to claim 18, wherein the baking is carried out at 70° C. to 200° C.

20. The method according to claim 17, wherein water is used as a medium for the light source in the light exposure.

21. The method according to claim 17, wherein the developing is carried out using a 0.01~5% (w/w) solution of tetramethylammoniumhydroxide (TMAH) in water.

22. A top anti-reflective coating composition, comprising:
(a) a top anti-reflective coating terpolymer represented by Formula 1, below:

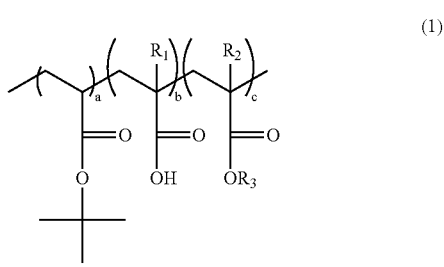

wherein $R_1$ and $R_2$ are independently hydrogen, fluoro, methyl or fluoromethyl; $R_3$ is a $C_{1-10}$ hydrocarbon or a $C_{1-10}$ hydrocarbon in which the hydrogen atoms are partly replaced by fluorine atoms; and a, b and c, representing the mole fraction of each monomer, are in the range between 0.05 and 0.9
(b) a photoacid generator; and,
(c) n-butanol,
wherein the composition is prepared by dissolving the top anti-reflective coating terpolymer in 1,000 wt. % to 10,000 wt. % of n-butanol, based on the weight of the terpolymer.

* * * * *